(12) United States Patent
Chen

(10) Patent No.: US 10,727,258 B2
(45) Date of Patent: Jul. 28, 2020

(54) DISPLAY DEVICE AND ACTIVE ARRAY SWITCH SUBSTRATE THEREOF

(71) Applicants: HKC Corporation Limited, Shenzhen, Guangdong (CN); Chongqing HKC Optoelectronics Technology Co., Ltd., Chongqing (CN)

(72) Inventor: Yu-Jen Chen, Chongqing (CN)

(73) Assignees: HKC Corporation Limited, Shenzhen, Guangdong (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 35 days.

(21) Appl. No.: 16/082,899

(22) PCT Filed: May 31, 2017

(86) PCT No.: PCT/CN2017/086641
§ 371 (c)(1),
(2) Date: Sep. 6, 2018

(87) PCT Pub. No.: WO2018/205320
PCT Pub. Date: Nov. 15, 2018

(65) Prior Publication Data
US 2019/0312068 A1 Oct. 10, 2019

(30) Foreign Application Priority Data

May 12, 2017 (CN) .......................... 2017 1 0335553

(51) Int. Cl.
*H01L 27/144* (2006.01)
*H01L 27/142* (2014.01)
(Continued)

(52) U.S. Cl.
CPC .......... *H01L 27/142* (2013.01); *G02F 1/1343* (2013.01); *G02F 1/13306* (2013.01);
(Continued)

(58) Field of Classification Search
CPC ................. H01L 27/142; H01L 31/075; H01L 31/022475; H01L 31/022483;
(Continued)

(56) References Cited

U.S. PATENT DOCUMENTS

2002/0011264 A1* 1/2002 Saito ................. H01L 31/03685
136/258
2005/0028860 A1* 2/2005 Sano ..................... H01L 31/076
136/249

(Continued)

FOREIGN PATENT DOCUMENTS

| CN | 101257056 A | 9/2008 |
|---|---|---|
| CN | 101499496 A | 8/2009 |

(Continued)

*Primary Examiner* — Karen Kusumakar
(74) *Attorney, Agent, or Firm* — Muncy, Geissler, Olds & Lowe, P.C.

(57) ABSTRACT

This application provides a display device and an active array switch substrate thereof. The active array switch substrate includes: a substrate; active array switches, formed on the substrate, where the active array switch includes a source electrode; at least one solar structure, disposed on the source electrode, where the solar structure includes a solar cell; and a transparent electrode, covered on the solar cell. The solar cell includes an N-type layer, an I-type layer of a microcrystalline silicon structure, and a P-type layer sequentially stacked in a direction away from the source electrode.

12 Claims, 4 Drawing Sheets

(51) Int. Cl.
  *H01L 31/0224* (2006.01)
  *H01L 31/065* (2012.01)
  *H01L 31/075* (2012.01)
  *G02F 1/133* (2006.01)
  *G02F 1/1343* (2006.01)
  *H01L 31/0368* (2006.01)
  *H01L 31/14* (2006.01)

(52) U.S. Cl.
  CPC .. *G02F 1/13439* (2013.01); *H01L 31/022475* (2013.01); *H01L 31/022483* (2013.01); *H01L 31/065* (2013.01); *H01L 31/075* (2013.01); *G02F 2001/13324* (2013.01); *H01L 31/03685* (2013.01); *H01L 31/14* (2013.01); *Y02E 10/50* (2013.01)

(58) Field of Classification Search
  CPC . H01L 31/065; H01L 31/03685; H01L 31/14; G02F 1/13306; G02F 1/13439; G02F 1/1343; G02F 2001/13324; Y02E 10/50
  See application file for complete search history.

(56) References Cited

U.S. PATENT DOCUMENTS

| | | | |
|---|---|---|---|
| 2009/0009675 A1* | 1/2009 | Cho | H01L 31/0352 349/43 |
| 2009/0108757 A1* | 4/2009 | Lee | H01L 27/288 315/51 |

FOREIGN PATENT DOCUMENTS

| | | |
|---|---|---|
| CN | 101866964 A | 10/2010 |
| CN | 102723344 A | 10/2012 |
| CN | 104538477 A | 4/2015 |

* cited by examiner

DISPLAY DEVICE AND ACTIVE ARRAY SWITCH SUBSTRATE THEREOF

BACKGROUND

Technical Field

This application relates to a display device and an active array switch substrate thereof, and in particular, to a display device and active array switches thereof being able to increase solar energy generation efficiency.

Related Art

Solar energy is a pollution-free energy that can resolve a current problem of energy shortage and petrochemical energy pollution, and has long been a focus that draws most attention. Being capable of directly converting solar energy to electric energy, solar cells have become a research subject of considerable importance currently. In the current solar cell market, approximately 90% or more of solar cells use monocrystalline silicon and polycrystalline silicon. However, because these solar cells need to use silicon chips having thicknesses of approximately 150 microns to 350 microns as materials, the solar cells have relatively high costs. Further, in recent years, an obvious increase in the quantity of high-quality silicon ingots used as raw materials of the solar cells leads to gradual shortage of the high-quality silicon ingots. Therefore, research and development of thin film solar cells having low costs, easy for massive production and having a simple modularization process has become a new development direction.

According to the photo-electric effect, when a ray of light is irradiated onto a conductor or a semiconductor, photons act with electrons in the conductor or the semiconductor, causing the electrons to flow. A shorter wavelength of the light indicates a higher frequency, so that the electrons have higher energy. For example, an ultraviolet ray has higher energy than an infrared ray. Therefore, the same material generates higher energy of mobile electrons when the material is irradiated by the ultraviolet ray. Not a light of any wavelength can be converted to electric energy. A current can be generated only when a frequency exceeds a standard value for generating the photo-electric effect.

An amorphous silicon (a-Si) thin film is usually used in an optical-to-electrical conversion layer of a solar cell in the prior art. However, because an energy gap of the a-Si thin film is in a range of 1.75 eV to 1.8 eV, the a-Si thin film can absorb only sunlight having a wavelength of less than 750 nm, and cannot absorb an entire solar spectrum, leading to relatively low optical-to-electrical conversion efficiency of the silicon thin film solar cell.

SUMMARY

To resolve the foregoing problem of relatively low optical-to-electrical conversion efficiency, an objective of this application is to provide substrate, comprising: a substrate; active array switches, formed on the substrate, where the active array switch comprises a source electrode; at least one solar structure, disposed on the source electrode, where the solar structure comprises a solar cell; and a transparent electrode, covered on the solar cell, where the solar cell comprises an N-type layer, an I-type layer of a microcrystalline silicon structure, and a P-type layer sequentially stacked in a direction away from the source electrode.

In an embodiment of this application, the I-type layer of the microcrystalline silicon structure is manufactured by performing plasma enhanced chemical vapor deposition (PECVD) on silane ($SiH_4$) and hydrogen ($H_2$), where a mixed ratio of the $H_2$ to the $SiH_4$ is in a range of 40 to 200.

In an embodiment of this application, an material of the transparent electrode is one selected from zinc oxide (ZnO), stannic oxide ($SnO_2$), indium tin oxide (ITO), and indium oxide ($In_2O_3$).

In an embodiment of this application, the I-type layer of the microcrystalline silicon structure is a main area for optical-to-electrical conversion.

To resolve the foregoing problem of relatively low optical-to-electrical conversion efficiency, another objective of this application is to provide an active array switch substrate, comprising: a substrate; active array switches, formed on the substrate, where the active array switch comprises a source electrode; a first solar structure, disposed on the source electrode, where the first solar structure comprises a first solar cell; a second solar structure, disposed on the first solar structure, where the second solar structure includes a second solar cell; and a transparent electrode, covered on the second solar cell, where the first solar cell includes an N-type layer, an I-type layer of a microcrystalline silicon structure, and a P-type layer sequentially stacked in a direction away from the source electrode, and the second solar cell comprises an N-type layer, an I-type layer of an a-Si structure and a P-type layer sequentially stacked in a direction away from the source electrode.

In an embodiment of this application, the I-type layer of the microcrystalline silicon structure is manufactured by performing PECVD on $SiH_4$ and $H_2$, and a mixed ratio of the $H_2$ to the $SiH_4$ is in a range of 40 to 200.

In an embodiment of this application, an material of the transparent electrode is one selected from ZnO, $SnO_2$, ITO, and $In_2O_3$.

In an embodiment of this application, the I-type layer of the microcrystalline silicon structure and the I-type layer of the a-Si structure are main areas for optical-to-electrical conversion.

To resolve the foregoing problem of relatively low optical-to-electrical conversion efficiency, a still another objective of this application is to provide a display device, comprising: a display panel; at least one tandem solar structure, disposed on a periphery of the display panel, and configured to absorb and convert a ray of light to electric energy for the display panel; and active array switches, disposed on one side of the display panel, and configured to control an image-display function of the display panel.

In an embodiment of this application, the tandem solar structure comprises: a transparent substrate; a plurality of transparent electrodes, disposed on the transparent substrate at equal spacing; a plurality of solar structures, respectively deposited on the corresponding transparent electrodes at suitable spacing, to define each transparent electrode and a corresponding solar structure as a solar cell unit; and a plurality of metal electrodes, respectively formed on the corresponding solar structures, where the solar structure comprises a first solar cell and a second solar cell, where the suitable spacing enables the transparent electrode to be partially exposed without being totally covered by the solar structure.

In an embodiment of this application, an material of the transparent electrode is one selected from ZnO, $SnO_2$, ITO, and $In_2O_3$.

In an embodiment of this application, the material of the metal electrode is one selected from aluminum (Al), silver (Ag), molybdenum (Mo), copper (Cu), titanium (Ti), and an alloy thereof.

In an embodiment of this application, the I-type layer of the microcrystalline silicon structure and the I-type layer of the a-Si structure are main areas for optical-to-electrical conversion.

Microcrystalline silicon can absorb sunlight having a long wavelength, so that if each of the foregoing embodiments is applied to a display device, solar energy generation efficiency can be effectively improved.

DETAILED DESCRIPTION

The following embodiments are described below with reference to the accompanying drawings, which are used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In figures, units with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, in this specification, unless otherwise explicitly described to have an opposite meaning, the word "include" is understood as including the component, but not excluding any other component. In addition, in this specification, "on" means that a component is located on or below a target component, but does not mean that the component needs to be located on top of the gravity direction.

To further describe the technical means adopted in this application to achieve the intended inventive objective and effects thereof, specific implementations, structures, features, and effects of a display device and an active array switch substrate thereof provided according to this application are described below in detail with reference to the drawings and preferred embodiments.

Figure 1:
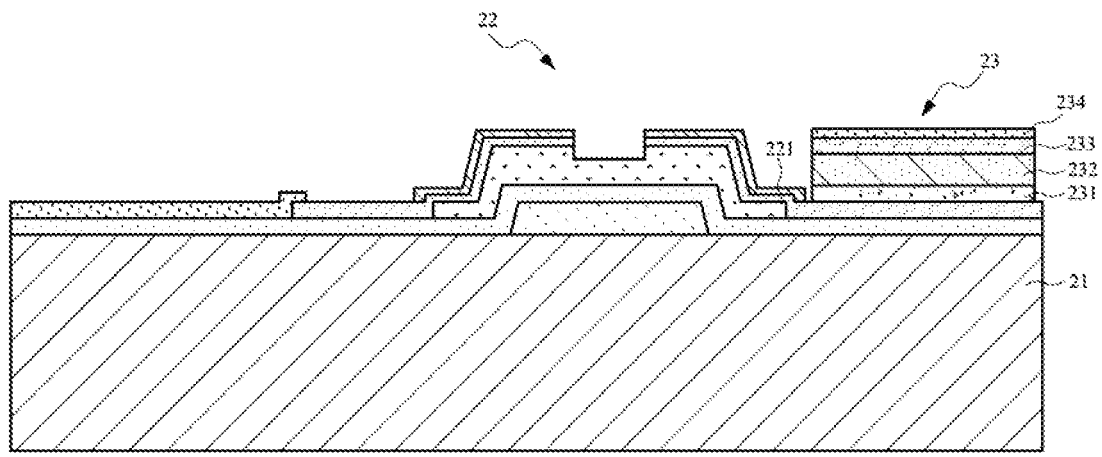
FIG. 1 is a schematic structural diagram of an active array switch substrate according to this application.

Referring to FIG. 1, FIG. 1 is a schematic structural diagram of an active array switch substrate according to this application. As shown in FIG. 1, the active array switch substrate in this application includes: a substrate 21; active array switches 22 formed on the substrate 21, configured to drive a liquid crystal structure (not shown in the figure) in a display device, and the active array switch 22 includes a source electrode 221; at least one solar structure 23 disposed on the source electrode 221 and the solar structure 23 can absorb and convert a ray of light to electric energy for the display device; and a transparent electrode 234, covered on the solar structure 23.

In this embodiment, the solar structure 23 is a thin film solar cell that is of a P-I-N microcrystalline silicon structure. A bottom layer of the thin film solar cell is an N-type layer 231, a middle layer of the thin film solar cell is an I-type layer 232 of a microcrystalline silicon structure, and an upper layer of the thin film solar cell is a P-type layer 233. That is, the N, I, and P layers are sequentially stacked in a direction away from the source electrode 221. The I-type layer 232 of the microcrystalline silicon structure is a main area for optical-to-electrical conversion.

An active array switch commonly used by an exemplary display device is a thin film transistor (TFT). However, among current silicon-based solar cells, a multi-junction thin film solar cell that uses a-Si/microcrystalline silicon is most efficient. In addition, a process device may manufacture the multi-junction thin film solar cell that uses a-Si/microcrystalline silicon by means of plasma enhanced chemical vapor deposition (PECVD) by using which the TFT is manufactured. Therefore, the multi-junction thin film solar cell that uses a-Si/microcrystalline silicon and the TFT are suitable to be combined. Because a method for manufacturing a TFT is a well-known technology for a person of ordinary skill in the art, details are not described herein again. After the TFT used as the active array switch is completed, further, N-type a-Si may be deposited on the source electrode 221 of the active array switch 22, to form the N-type layer 231 of the thin film solar cell. Then, the I-type layer 232 of the microcrystalline silicon structure is manufactured on the N-type layer 231. The I-type layer 232 of the microcrystalline silicon structure is manufactured by performing PECVD on a mixed gas source that includes $SiH_4$ and $H_2$. The doping amount of the $H_2$ needs to occupy a pretty high percentage in the mixed gas, to increase crystallinity of the microcrystalline silicon structure. In this embodiment of this application, a mixed ratio of the $H_2$ to the $SiH_4$ is in a range of 40 to 200. After the I-type layer 232 is completed, further, P-type a-Si is deposited on the I-type layer 232, to form the P-type layer 233. Then, the transparent electrode 234 is plated on the P-type layer 233, to help conduct out a generated current. In this way, manufacturing of the solar structure 23 is completed. A material of the transparent electrode 234 may be one selected from ZnO, $SnO_2$, ITO, and $In_2O_3$.

Figure 2:
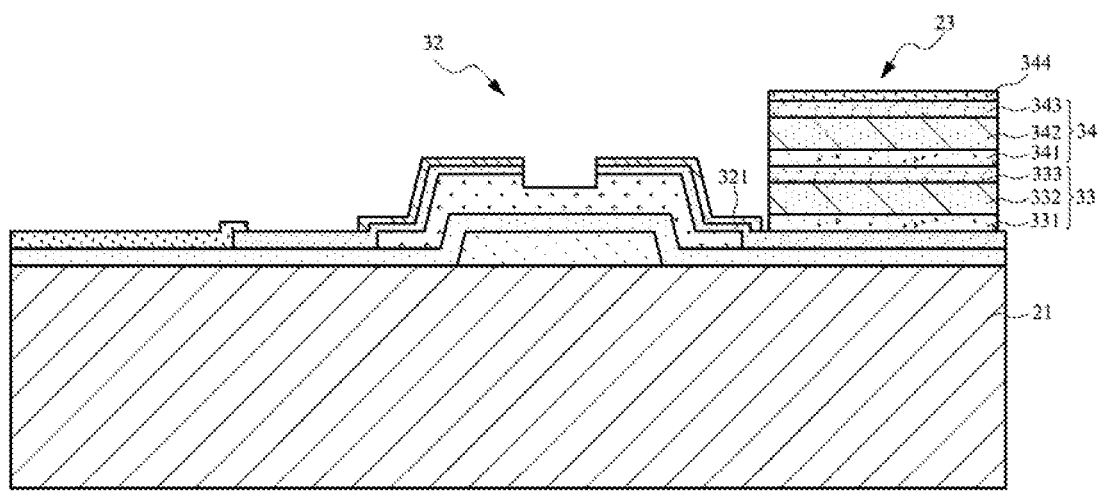
FIG. 2 is a schematic structural diagram of an active array switch substrate according to another embodiment of this application.

Referring to FIG. 2, FIG. 2 is a schematic structural diagram of an active array switch substrate according to another embodiment of this application. A specific process is approximately the same as described in the foregoing embodiment. After a TFT used as an active array switch is completed, N-type a-Si may be first deposited on a source electrode 321 of the active array switch 32, to form an N-type layer 331 of a first solar structure 33. Then, an I-type layer 332 of a microcrystalline silicon structure is manufactured on the N-type layer 331. Next, P-type a-Si is deposited on the I-type layer 332, to form a P-type layer 333. In this way, the first solar structure 33 is completed, forming a thin film solar cell made of P-I-N microcrystalline silicon.

Next, a second solar structure 34 is manufactured on the first solar structure 33 in a same manner. That is, N-type a-Si is first deposited on the first solar structure 33, to form an N-type layer 341 of the second solar structure 34. Then, an I-type layer 342 is manufactured on the N-type layer 341. A-Si or a germanium oxide (GeOC) layer may be selected as the material of the I-type layer 342 according to a requirement. In this embodiment, a-Si is used, but this application is not limited thereto. Next, P-type a-Si is deposited on the I-type layer 342, to form a P-type layer 343. Finally, a transparent electrode 344 is plated on the P-type layer 343, to help conduct out a generated current. In this way, the second solar structure 34 is completed, forming a thin film solar cell made of P-I-N a-Si. In another word, the thin film solar cell made of P-I-N microcrystalline silicon includes the N-type layer, the I-type layer of the microcrystalline silicon structure, and the P-type layer that are sequentially stacked in a direction away from the source electrode 321. The thin film solar cell made of P-I-N a-Si includes the N-type layer, the I-type layer of the a-Si structure, and the P-type layer that are sequentially stacked in a direction away from the source electrode 321. The I-type layer of the thin film solar cell made of P-I-N microcrystalline silicon and the I-type layer of the thin film solar cell made of P-I-N a-Si are respectively main areas for optical-to-electrical conversion.

Likewise, a material of the transparent electrode 344 may be one selected from ZnO, $SnO_2$, ITO, and $In_2O_3$. The first solar structure 33 is connected in tandem to the second solar structure 34, so that a multi-junction thin film solar cell is formed, thereby greatly improving light absorption efficiency.

Figure 3:
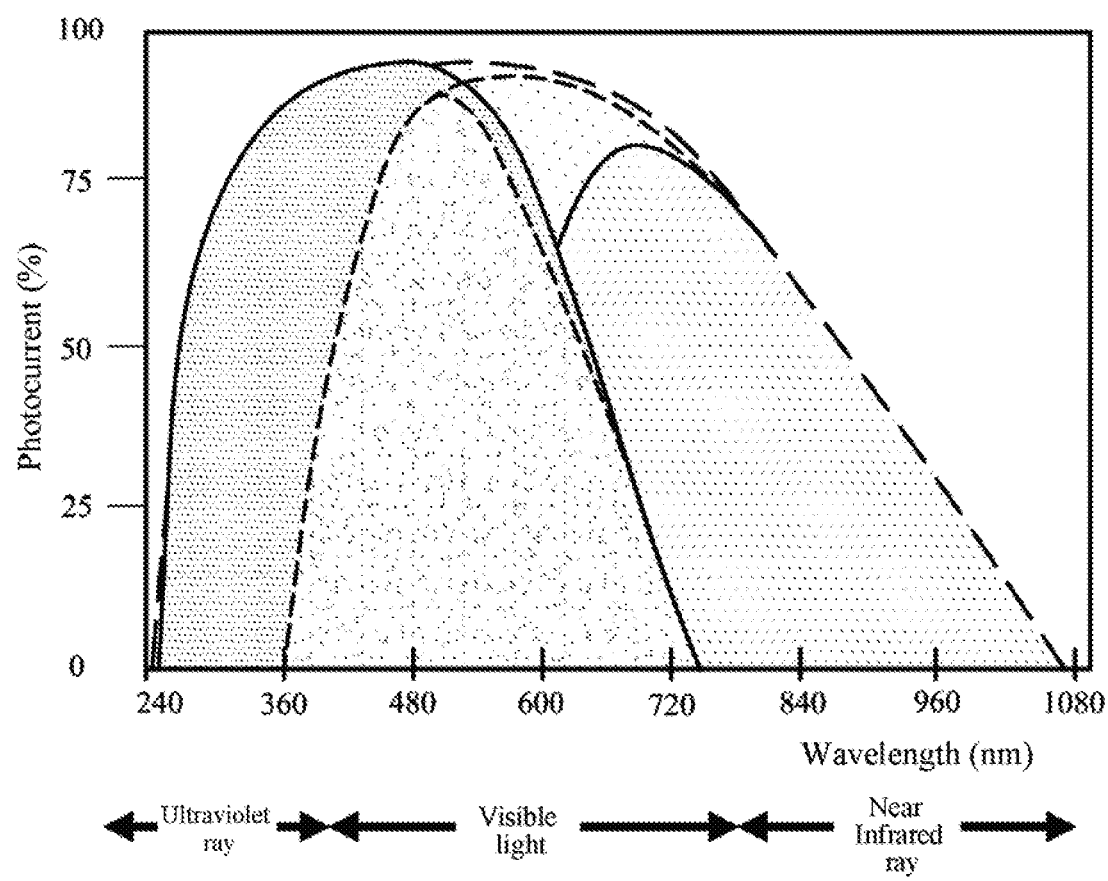
FIG. 3 is an optical wavelength-photocurrent spectrogram of a thin film solar cell made of P-I-N microcrystalline silicon according to this application.

Further, referring to FIG. 3, FIG. 3 is an optical wavelength-photocurrent spectrogram of a thin film solar cell made of P-I-N microcrystalline silicon according to this application. Usually, a common solar cell uses an a-Si thin film as an optical-to-electrical conversion layer. However, because an energy gap of the a-Si thin film is usually in a range of 1.75 eV to 1.8 eV, only light waves having wavelengths in a range of 360 nm to 750 nm can be absorbed, leading to relatively low efficiency. Therefore, to increase utilization of light waves for a solar cell, usually, a microcrystalline silicon thin film layer may further be stacked, to form a tandem solar cell and improve performance of the solar cell. An energy gap of microcrystalline silicon is usually in a range of 1.1 eV to 1.2 eV, so that optical wavelengths in a range of 750 nm to 1100 nm can be absorbed, thereby supplementing an optical band that cannot be absorbed by a-Si. In addition, wavelengths that can be absorbed by a GeOC layer are in a range of 240 nm to 750 nm. Therefore, a high-energy light wave having a wavelength of less than 360 nm may also be one of the optional materials.

Figure 4A:
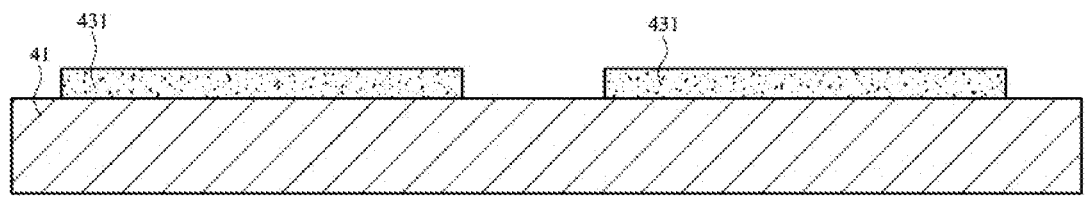
FIG. 4A to FIG. 4C are schematic diagrams of a thin film solar cell made of tandem P-I-N microcrystalline silicon according to this application.
Figure 4B:
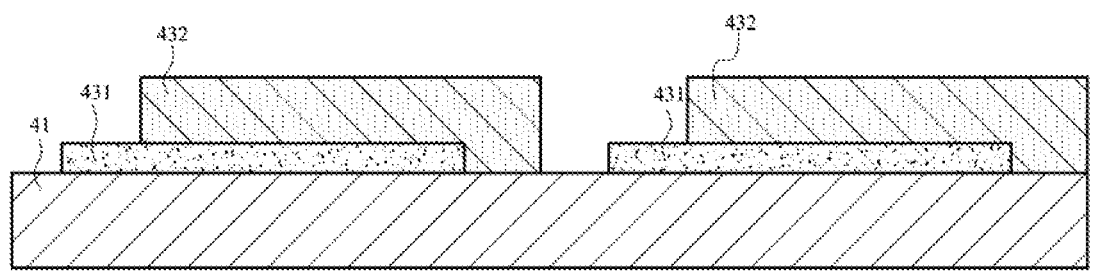
Figure 4C:
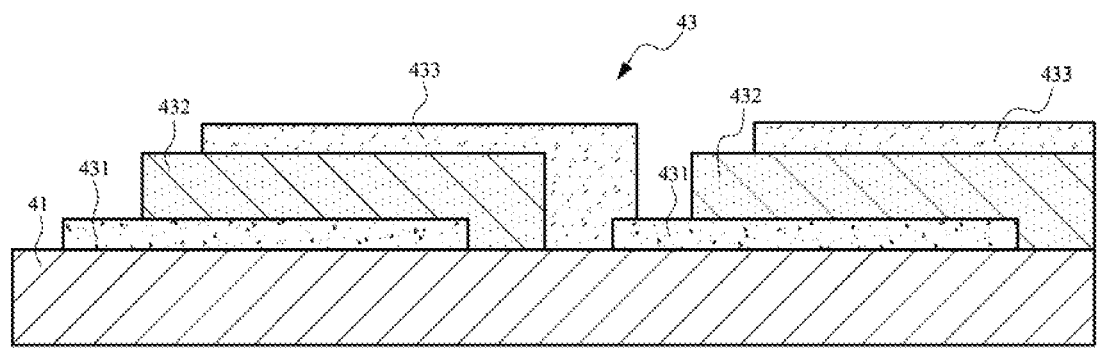

Referring to FIG. 4A to FIG. 4C, FIG. 4A to FIG. 4C are schematic diagrams of a thin film solar cell made of tandem P-I-N microcrystalline silicon according to this application. In the foregoing embodiment, the thin film solar cell is manufactured on a TFT-side substrate and is directly combined with the TFT. An advantage of such a design is that the thin film solar cell is directly connected to an electrical component, so that there is good electrical conductivity. However, there is an upper-side substrate that is above the thin film solar cell and that includes a color filter color resistance unit. In this case, the thin film solar cell is in and at a bottom of the entire display device, leading to relatively low efficiency of absorbing an external ray of light. Therefore, in this embodiment, the thin film solar cell is moved upward to one side of the upper-side substrate, to improve the efficiency of the thin film solar cell of absorbing an external ray of light.

For specific process steps, refer to 4A to 4C. First, a transparent substrate 41 is obtained. Then, a plurality of transparent electrodes 431 are plated on the transparent substrate 41 at equal spacing. The material of each transparent electrode 431 may be one selected from ZnO, $SnO_2$, ITO, and $In_2O_3$. Next, a spacing trench is etched by means of a patterning process, to define a size of a solar cell unit 43. Then, a plurality of solar structures 432 are respectively deposited on corresponding transparent electrodes 431 at suitable spacing, to define each transparent electrode 431 and a corresponding solar structure 432 as a solar cell unit 43. That is, one solar structure 432 includes one thin film solar cell made of P-I-N microcrystalline silicon and one thin film solar cell made of P-I-N a-Si. Likewise, further, a spacing trench between solar cell units 43 is etched by means of a patterning process. The spacing trench is slightly offset by a distance compared with a previous spacing trench between the transparent electrodes 431, so that each transparent electrode 431 can be partially exposed and is not totally covered by at least one solar structure 432. Finally, a metal electrode 433 is plated on the P-I-N microcrystalline silicon structure 432. Al, Ag, Mo, Cu, Ti, or another suitable metal or alloy may be selected as the material of the metal electrode 433. Likewise, further, a spacing trench between solar cell units 43 is etched by means of a patterning process. The spacing trench is also slightly offset by a distance compared with a previous spacing trench between the P-I-N microcrystalline silicon structures 432, so that metal electrodes 433 of different solar cell units 43 can be totally separated, and can be electrically connected to a transparent electrode 431 of an adjacent solar cell unit 43. In this way, an electrical series-connected structure is formed by all solar cell units 43, so that a current generated by each solar cell unit 43 can be successfully conducted out and be applied.

Figure 5:
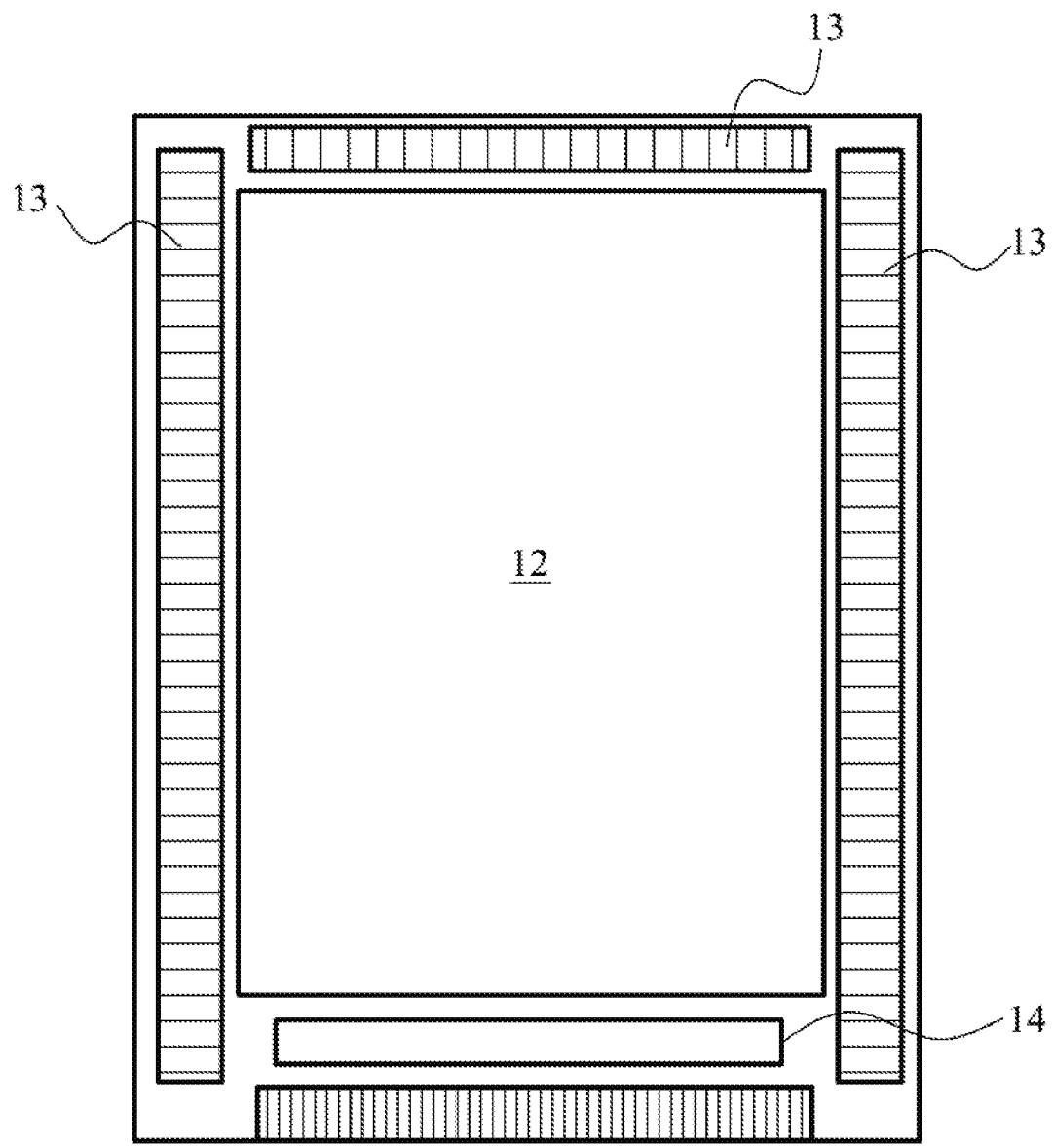
FIG. 5 is a schematic diagram of a display device using a thin film solar cell made of tandem P-I-N microcrystalline silicon according to this application.

Referring to FIG. 5, FIG. 5 is a schematic diagram of a display device that uses a thin film solar cell made of tandem P-I-N microcrystalline silicon according to this application. As shown in FIG. 5, the display device includes: a display panel 12; at least one solar structure 13 disposed on a periphery of the display panel 12 and configured to absorb and convert a ray of light to electric energy for the display device; and active array switches 14, disposed on one side of the display panel 12 and configured to control an image-display function of the display panel 12. In the display device manufactured according to this embodiment, an image may be displayed by providing electric energy by an external power supply. Alternatively, the display device may be driven by electric energy generated by irradiation of an external optical source, to display an image.

In different embodiments, the display panel 12 may be, for example, a liquid crystal display panel, an OLED display panel, a QLED display panel, a curved-surface display panel, or another display panel.

In this application, the thin film solar cell is added into the exemplary display device. A process device of the display device with the thin film solar cell therein is the same as a process device used by the original display device, so that additional burden in respect of the process device is avoided. In addition, the added thin film solar cell can provide required electric energy for the display device. It is estimated that efficiency of developing products related to a display device can be effectively improved. Microcrystalline silicon can absorb sunlight having a long wavelength, so that if microcrystalline silicon is applied to a display device, solar energy generation efficiency can further be improved.

Terms such as "in an embodiment of this application" and "in various embodiments" are repeatedly used. Usually, the terms do not refer to the same embodiment; but they may also refer to the same embodiment. Words such as "include", "have", "include" are synonyms, unless other meanings are indicated in the context.

The foregoing descriptions are merely preferred embodiments of this application, and are not intended to limit this application in any form. Although this application has been disclosed above through the preferred embodiments, the embodiments are not intended to limit this application. Any person skilled in the art can make some equivalent variations or modifications according to the foregoing disclosed technical content without departing from the scope of the technical solutions of this application to obtain equivalent embodiments. Any simple amendment, equivalent change or modification made to the foregoing embodiments according to the technical essence of this application without departing from the content of the technical solutions of this application shall fall within the scope of the technical solutions of this application.

What is claimed is:

1. An active array switch substrate, comprising:
   a substrate;
   active array switches, formed on the substrate, wherein the active array switch comprises a source electrode;
   at least one solar structure, disposed on the source electrode, wherein the solar structure comprises a solar cell; and
   a transparent electrode, covered on the solar cell, wherein the solar cell comprises an N-type layer, an I-type layer of a microcrystalline silicon structure, and a P-type layer sequentially stacked in a direction away from the source electrode;
   wherein suitable spacing enables the transparent electrode to be partially exposed without being totally covered by the solar structure.

2. The active array switch substrate according to claim 1, wherein the I-type layer of the microcrystalline silicon structure is manufactured by performing plasma enhanced chemical vapor deposition (PECVD) on silane ($SiH_4$) and hydrogen ($H_2$), wherein a mixed ratio of the $H_2$ to the $SiH_4$ is in a range of 40 to 200.

3. The active array switch substrate according to claim 1, wherein a material of the transparent electrode is one selected from zinc oxide (ZnO), stannic oxide ($SnO_2$), indium tin oxide (ITO), and indium oxide ($In_2O_3$).

4. The active array switch substrate according to claim 1, wherein the I-type layer of the microcrystalline silicon structure is a main area for optical-to-electrical conversion.

5. An active array switch substrate, comprising:
   a substrate;
   active array switches, formed on the substrate, wherein the active array switch comprises a source electrode;
   a first solar structure, disposed on the source electrode, wherein the first solar structure comprises a first solar cell;
   a second solar structure, disposed on the first solar structure, wherein the second solar structure comprises a second solar cell; and
   a transparent electrode, covered on the second solar cell, wherein the first solar cell comprises an N-type layer, an I-type layer of a microcrystalline silicon structure, and a P-type layer sequentially stacked in a direction away from the source electrode, and the second solar cell comprises an N-type layer, an I-type layer of an amorphous silicon (a-Si) structure, and a P-type layer sequentially stacked in a direction away from the source electrode;
   wherein suitable spacing enables the transparent electrode to be partially exposed without being totally covered by the second solar structure.

6. The active array switch substrate according to claim 5, wherein the I-type layer of the microcrystalline silicon structure is manufactured by performing PECVD on $SiH_4$ and $H_2$, and a mixed ratio of the $H_2$ to the $SiH_4$ is in a range of 40 to 200.

7. The active array switch substrate according to claim 5, wherein a material of the transparent electrode is one selected from ZnO, $SnO_2$, ITO, and $In_2O_3$.

8. The active array switch substrate according to claim 5, wherein the I-type layer of the microcrystalline silicon structure and the I-type layer of the a-Si structure are main areas for optical-to-electrical conversion.

9. A display device, comprising:
   a display panel;
   at least one tandem solar structure, disposed on a periphery of the display panel, and configured to absorb and convert a ray of light to electric energy for the display device; and
   active array switches, disposed on one side of the display panel, and configured to control an image-display function of the display panel;
   wherein the tandem solar structure comprises:
   a transparent substrate;
   a plurality of transparent electrodes, disposed on the transparent substrate at equal spacing;
   a plurality of solar structures, respectively deposited on the corresponding transparent electrodes at suitable spacing, to define each transparent electrode and a corresponding solar structure as a solar cell unit; and
   a plurality of metal electrodes, respectively formed on the corresponding solar structures, wherein
   the solar structure comprises a first solar cell and a second solar cell, wherein the suitable spacing enables the transparent electrode to be partially exposed without being totally covered by the solar structure.

10. The display device according to claim 9, wherein a material of the transparent electrode is one selected from ZnO, $SnO_2$, ITO, and $In_2O_3$.

11. The display device according to claim 9, wherein a material of the metal electrode is one selected from aluminum (Al), silver (Ag), molybdenum (Mo), copper (Cu), titanium (Ti), and an alloy thereof.

12. The display device according to claim 9, wherein the I-type layer of the microcrystalline silicon structure and the I-type layer of the a-Si structure are main areas for optical-to-electrical conversion.

* * * * *